United States Patent [19]

Finnila et al.

[11] 4,142,198

[45] Feb. 27, 1979

[54] MONOLITHIC EXTRINSIC SILICON INFRARED DETECTORS WITH AN IMPROVED CHARGE COLLECTION STRUCTURE

[75] Inventors: Ronald M. Finnila, Costa Mesa; Stephen C. Su, Huntington Beach, both of Calif.

[73] Assignee: Hughes Aircraft Company, Culver City, Calif.

[21] Appl. No.: 702,548

[22] Filed: Jul. 6, 1976

[51] Int. Cl.$^2$ .................. H01L 29/78; H01L 27/14; H01L 31/00; G11C 19/28
[52] U.S. Cl. ...................................... 357/24; 357/30; 357/59; 357/63; 307/221 D; 307/311; 250/211 J; 250/338
[58] Field of Search .................... 357/24, 30; 307/304, 307/311; 250/211 J, 332, 334, 338, 340

[56] References Cited

U.S. PATENT DOCUMENTS

| | | | |
|---|---|---|---|
| 3,660,697 | 5/1972 | Berglund et al. | 357/24 |
| 3,771,149 | 11/1973 | Collins et al. | 357/24 |
| 3,808,435 | 4/1974 | Bate et al. | 357/24 |
| 3,845,295 | 10/1974 | Williams et al. | 357/24 |
| 3,849,651 | 11/1974 | Ennulat | 357/24 |
| 3,883,437 | 5/1975 | Nummedal et al. | 357/24 |
| 3,896,474 | 7/1975 | Amelio et al. | 357/24 |
| 3,896,485 | 7/1975 | Early | 357/24 |
| 3,902,066 | 8/1975 | Roosild et al. | 357/24 |
| 3,969,634 | 7/1976 | Su et al. | 357/24 |

OTHER PUBLICATIONS

Nummedal et al., "Charge Coupled Device Readout of Infrared Detectors", Paper Presented Int. Conf. Technology and Applications, Charge Coupled Devices, Edinburgh (9/74).
Barbe, "Solid State Infrared Imaging" NATO Advanced Study Institute Louvain-la-Neuve, Belgium (9/75), published in Jespers et al., Eds. *Solid State Imaging*, Noordhoff Publ., Leyden, Netherlands (1976).
Nelson, "Accumulation-Mode Charge-Coupled Device", Applied Physics Letters, vol. 10 (11/74), pp. 568–570.

*Primary Examiner*—William D. Larkins
*Assistant Examiner*—Gene M. Munson
*Attorney, Agent, or Firm*—G. Tacticos; E. N. Kramsky; W. H. MacAllister

[57] ABSTRACT

There is disclosed an all silicon monolithic focal plane array of infrared detectors for image detection. The structure comprises an epitaxial layer grown on an extrinsically doped silicon substrate. The detectors are formed in and extend through the substrate, the material of which is sensitive to specific wavelength infrared signals according to the dopant used in the substrate. The collection of charges takes place on a buried layer formed around a portion of the epitaxial layer-substrate interface, and the charges are then transferred through a surface layer of the same conductivity type to the surface of the epitaxial layer. The signal readout function is performed by a charge coupled device shift register constructed in the epitaxial layer by providing selectively spaced electrodes in an insulating layer. Carriers generated in the detector by incident infrared radiation are collected into the buried layer and then pass through the surface layer, are injected therefrom into the CCD shift register and are detected at the output. The monolithic construction and the use of an epitaxial layer to form the CCD shift register result in high yield and high efficiency devices. The planar surface of the device improves the aluminum step coverage for a more reliable device, and the use of the buried layer improves the fill factor of the detector.

29 Claims, 6 Drawing Figures

MONOLITHIC EXTRINSIC SILICON INFRARED DETECTORS WITH AN IMPROVED CHARGE COLLECTION STRUCTURE

The invention herein claimed was reduced to practice in the course of or under contract with the United States Department of the Army.

FIELD OF THE INVENTION

This invention relates generally to detectors and more particularly to a monolithic extrinsic silicon infrared detector containing a CCD structure to perform the signal readout functions of the device. The CCD structure is constructed on a portion of an epitaxial layer adjacent to a surface of the detector substrate.

RELATED APPLICATIONS

The device disclosed herein may include, but does not require, circuitry for removing the DC component or background representing charge of the type disclosed in our copending U.S. patent application Ser. No. 601,124, filed July 31, 1975, now U.S. Pat. No. 3,969,634, issued July 13, 1976, and entitled "Bucket Background Subtraction Circuit for Charge Coupled Devices," which is assigned to the present assignee. The bucket background subtraction circuit is hereinafter referred to as "BBS."

In another copending U.S. patent application, Ser. No. 614,277, filed Aug. 17, 1975, and entitled "Monolithic Extrinsic Silicon Infrared Detectors with Charge Coupled Device Readout," and assigned to the present assignee, there is disclosed and generically claimed a broad new class of IR detectors and related fabrication processes wherein, among other things, the IR detector and associated CCD circuitry for the signal readout function are combined in a novel manner to produce a monolithic extrinsic silicon detector structure.

BACKGROUND OF THE INVENTION AND PRIOR ART

The present invention relates generally to imagers having a focal plane array of infrared detectors and charge coupled device signal processing circuitry associated with the detectors to transfer the signals produced by the detectors into data processing apparatus where the image may be reconstructed from the signals in a manner determined by the particular mode of scanning employed. Imagers of this general type are disclosed, for example, in the following U.S. patents:

B. K. Weimer, U.S. Pat. No. 3,683,193
Y. Takamura, U.S. Pat. No. 3,777,061
D. R. Collins, U.S. Pat. No. 3,771,149
K. Nummedal, U.S. Pat. No. 3,883,437.

In the prior art, of which the foregoing patents are typical, efforts to integrate the photodetectors of such an array with a charge coupled circuitry have in the past led either to hybrid devices wherein the detectors were mounted on top of a separate semiconductor substrate in which the charge coupled circuitry was contained or to an arrangement wherein the photodetectors were formed as portions of the same semiconductor substrate containing the charge coupled circuitry.

The device disclosed and claimed in our copending application Ser. No. 614,277 represents a successful monolithic integration of the detector and its associated CCD circuitry into one efficient and low-cost device.

In the fabrication of our earlier structure disclosed in Ser. No. 614,277, an epitaxial layer is formed on an IR detector substrate and then a portion of that epitaxial layer is etched away as to permit infrared radiation to impinge on the individual detectors of the substrate. This produces charges which are then read out by direct injection into the charge coupled device which is built on the epitaxial layer and functions to transfer charges through the epitaxial layer and into the output of the device. We believe that our invention disclosed and claimed in the aforementioned patent application represents truly significant advances in this art as explained in detail in said application. Our present invention extends the developments in this area of technology and has the further advantage of eliminating the need for removing a portion of the epitaxial layer. Moreover, through the use of a buried layer/surface layer combination, this structure further improves the transfer efficiency of charges from the detector to the charge coupled device thereof and the "fill factor" of the detector.

SUMMARY OF THE INVENTION

The general purpose of this invention is to provide a new and improved image detector, having most if not all of the advantages and features of similarly employed devices, while eliminating many of the aforementioned disadvantages of prior art structures.

To accomplish this purpose, we have provided a novel structure including an image detector operable to generate electrical charge signals in response to optical radiation, and having means for processing said signals comprising a charge coupled signal collecting device for transferring charge to a utilization circuit.

This structure comprises a semiconductor substrate of a first conductivity type having a continuous charge propagating layer adjacent to said semiconductor substrate and having a second type of conductivity. The substrate includes an optical detector region formed in at least a portion of the semiconductor substrate for generating charge in response to received radiation. The structure further includes means adjacent to the charge propagating layer for the transfer of charge from the optical detector region to the charge propagating region. On the top of the charge propagating layer there is an insulating layer of dielectric material and a plurality of electrode means that are spaced from the charge propagating layer by at least a portion of the insulating layer. These electrode means are for processing charge generated in the optical detector region and for moving it along the propagating layer to a utilization circuit.

In a preferred embodiment of this invention the charge propagating layer is an epitaxial layer formed on a surface of the semiconductor substrate. The means for the transfer of charges from the optical detector region to the epitaxial layer may include in combination a heavily doped buried layer of a first conductivity type disposed adjacent a portion of the interface between the semiconductor substrate and the epitaxial layer and a heavily doped surface layer of a first type of conductivity formed in the epitaxial layer adjacent at least a portion of the buried layer and the exposed surface of the epitaxial layer at a predetermined region. This device is operative to transfer signal charges from the detector element through the buried layer and the surface layer and through the epitaxial layer to the utilization circuit.

Such transfer is made typically in response to a cyclical voltage applied to the electrode means to control the potential profile in the epitaxial layer.

The aforementioned buried layer at the epitaxial layer-substrate interface is used as a charge collector for the extrinsically doped substrate. The aforementioned surface layer, which is electrically connected to the adjacent buried layer, injects the collected charge from the extrinsically doped substrate into the charge coupled device (hereinafter referred to as CCD).

DETAILED DESCRIPTION

For example, in a gallium doped substrate, the subsurface charge collector would be a $P^+$ buried layer (e.g. boron-doped) and a corresponding $P^+$ (e.g. boron doped) surface region in the epitaxial region, physically or electrically contacting the $P^+$ buried layer and serving as the input diffusion to a CCD shift register located in the epitaxial layer. Under low temperature (4° k.–20° k.) the carriers in the gallium doped substrate are frozen out in the dopant level. Hence, incoming infrared signals with wavelengths such that the incident energy is equal to or greater than the ionization energy of the dopant level will generate carriers in the detector region. These generated carriers are collected by the $P^+$ buried layer and injected through the $P^+$ surface layer into the CCD shift register formed in the epitaxial layer and are detected at the output end thereof. Such devices are of particular interest in the infrared wavelength ranges of 3–5 micrometers and 8–14 micrometers for aircraft or missile tracking systems and the like.

This device may also include an $N^+$ buried layer (opposite to the conductivity type of buried layer adjacent the detector element) to shield the P channel CCD operation from the Si:Ga substrate and thus enable the room temperature testing of CCD devices even in a thin (3–4 μm) epitaxial layer.

The device may also include a bucket background subtraction circuit which has been more fully set forth and explained in our copending application Ser. No. 601,124, filed July 31, 1975, and entitled, "Bucket Background Subtraction Circuit for Charge Coupled Devices." From reference to that application it will be seen that the purpose of this portion of the circuitry which may optionally be used in this or other similar imaging devices, is to reduce the background or DC component level of the charge signal being supplied to the shift register, and to reduce the charge handling requirements imposed on the shift register.

The device may also have on the back side of the substrate a detector electrode to connect the detector element to an outside voltage source. The device may also have an optical absorbing layer to prevent optical cross talk due to reflections off the back surface of the substrate. The optical absorbing layer may be superimposed on an optical coupling layer which in turn is superimposed on a detector electrode formed on the back side of the substrate.

Another variation of such a detector is to replace the buried and surface layers with a transparent electrode spatially disposed over a predetermined portion of the epitaxial layer in a region above the detector region and insulated from the epitaxial layer by a portion of the insulating layer. When appropriate voltage is applied on this electrode, charge depletion takes place in the portion of the epitaxial layer adjacent the electrode. Charges produced by radiation in the detector region will be collected into this depletion region and then injected into the CCD circuitry. For this to be successful and efficient, the epitaxial layer must be thin enough so that there will be no need to apply an excessive voltage at the gate electrode to deplete the underlying section of the epitaxial layer.

Still another embodiment of this invention is to use both a buried layer in the epitaxial layer and a gate electrode above the epitaxial layer. Using this approach, devices with relatively thick epitaxial layers may be constructed. By using both a gate electrode and a buried layer, the depletion layer formed in the epitaxial layer by the capacitive effect reaches the degeneratively doped buried layer to form a region through which charges can be transferred from the detector element to the surface of the epitaxial layer and be injected into the CCD circuitry.

Radiation may penetrate the device from either the front or the back side. However, to be able to detect radiation coming from the back side, the device must not have in the back an optical absorbing layer, but instead it may have an antireflecting layer in its place.

One advantage of the present invention is that the surface of the device is basically planar. This makes easy to achieve a uniform and reliable aluminum step coverage and also makes feasible the use of projection printing for high resolution patterns. This later result makes the device amenable to a high yield process.

A further advantage is that a $P^+$ buried layer can be a single line or a grid pattern and the $P^+$ surface layer can be a very small portion of the entire detector area. This layout minimizes the free-carrier absorption problem in the heavily doped $P^+$ region for long wavelengths (8–14 μm) infrared signals.

Using this invention, both P-type and N-type image detectors can be constructed. Although most discussion in this specification focuses around the P-type detector having a P-type substrate, an N-type epitaxial layer, a $P^+$ buried layer, a $P^+$ surface layer, a P-channel CCD and an $N^+$ type shield layer, the same principles equally apply to an N-type detector with an N-type substrate, a P-type epitaxial layer, an $N^+$ buried layer, an $N^+$ surface layer, an N-channel CCD and a $P^+$ shield layer. For an N-type infrared detector arsenic may be used as a substrate dopant. The selection of the dopant for the substrate depends on the ultimate use of the detector. For example, indium or gallium may be used for the infrared range of 3–5 micrometers. Gallium may also be used for the infrared range of 8–14 micrometers. Arsenic may be used for applications in the range above 14 micrometers. Other dopants can be used for the different ranges of the optical spectrum. Although most of the discussion in this specification focuses on embodiments of the invention made for the detection of infrared radiation, the invention is not limited to infrared detectors but to optical detectors in general. The selection of the substrate dopant determines the ultimate wavelength sensitivity of the detector.

Accordingly, it is an object of the present invention to provide a new and improved monolithic extrinsic silicon optical detector with an improved charge collection scheme.

A feature of this invention is the provision of a monolithic extrinsic silicon IR detector with a charge coupled device operative to perform the signal readout function and a buried conducting layer and a surface conducting layer operative to transfer the charges from the detector element in the substrate to the charge coupled device in an epitaxial layer adjacent the substrate.

Another feature of this invention is the provision of a monolithic extrinsic silicon IR detector with a charge coupled device constructed in an epitaxial layer adjacent a substrate to perform the signal readout function and a gate electrode provided adjacent the epitaxial layer and spatially disposed over the detector element in the substrate, whereby the gate electrode creates a depletion region through the adjacent portion of the epitaxial layer to facilitate the transfer of charges from the detector element to the charge coupled device.

Another feature of this invention is the provision of a monolithic extrinsic silicon IR detector with at least one detector element in the substrate, a charge coupled device for the readout function constructed in a portion of an epitaxial layer adjacent the substrate and a gate electrode provided near a portion of a surface of the epitaxial layer. The gate electrode is spatially disposed over a conducting buried layer in the interface between the epitaxial layer and a part of the substrate in the vicinity of the detector element whereby with the application of an appropriate voltage on the gate electrode a depletion layer is created in the epitaxial layer large enough to reach the buried gate and to facilitate the transfer of charges from the detector element to the charge coupled device.

These and other objects and features of the invention will become apparent in the following description taken in conjunction with the accompanying drawings.

DETAILED DESCRIPTION OF DRAWINGS

Figure 1:
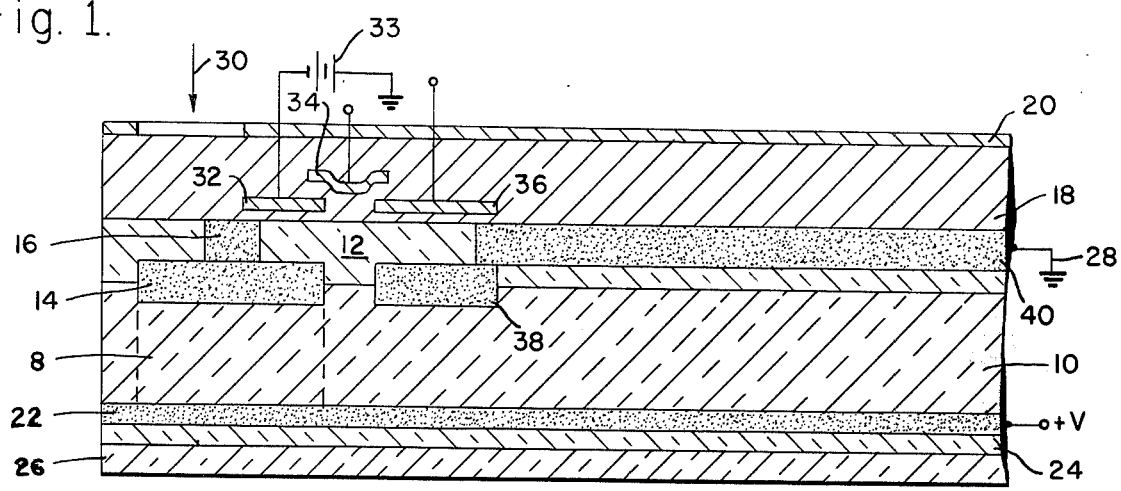
FIG. 1 is a diagrammatic cross-sectional view of an image detector device embodying the present invention. It includes a buried layer and a surface layer to transfer the charges from the detector element to the CCD circuitry.

Referring now to FIG. 1, there is shown a cross-sectional view of an infrared detector constructed in accordance with the present invention. Each detector element 8 is formed in a semiconductor substrate 10 and extends through it. In an exemplary device the substrate 10 was extrinsic silicon doped with gallium atoms to a concentration of approximately $3 \times 10^{16}$ atoms per $cm^3$. Other P-type dopants such as indium may also be used to produce a P-type substrate. Formed on the substrate 10 is an epitaxial layer 12 of N-type silicon through which infrared radiation can pass to reach the detector element. The epitaxial layer may be doped with phosphorous to prevent carrier freeze-out at operating temperatures. This layer is used for the CCD circuitry. The CCD may be a two-phase structure with overlapping polycrystalline silicon gate electrodes. On a portion of the epitaxial layer-substrate interface and in the vicinity of the detector element, there is a P+ buried layer 14. This layer is usually formed prior to the deposition of the epitaxial layer and it may be made by doping a portion of the substrate, over the detector element with a P-type impurity, such as, for example, boron. The P+ layer should be degenerately doped with a typical concentration of over $5 \times 10^{18}$ atoms/$cm^3$ such that carriers will not freeze-out completely at the device operating temperature (10°–20° k.), and yet it should not be so heavily doped as to hinder the later epitaxial deposition operation. This P+ buried layer will out-diffuse into the epitaxial layer during subsequent processing steps. A P+ surface layer 16 is formed in a way as to be electrically connected to the P+ buried layer at zero bias voltage. Carriers generated in the initially frozen-out Si:Ga substrate by IR irradiation will be collected by the P+ buried layer and injected under appropriate biasing conditions through the P+ surface layer into the CCD signal processing circuitry.

Above the epitaxial layer 12 there is a layer 18 of insulating material and on the top of the insulating layer there is a radiation shield 20. The radiation shield has an aperture in the area above the detector element to permit radiation to reach the detector after penetrating through the dielectric layer, the surface layer, and the buried layer. The radiation shield 20 can be made from an aluminum layer, but in order to minimize optical crosstalk due to reflections between the radiation shield and optical components, an absorbing material such as polyimide varnish is preferred. Optical crosstalk due to reflections off the back surface of the substrate 10 could also be a problem. Therefore, an optical absorbing layer 26 is superimposed over an optical coupling layer 24, which in turn is superimposed on a P+ diffused layer 22 formed on the back side of the substrate 10. Layer 22 is also referred to as a detector electrode, and is connected to a source of positive voltage V. The epitaxial layer 12 is normally connected to a ground 28.

A plurality of electrodes are disposed in the insulating layer 18 and the fields generated by the drive voltages applied to these electrodes cooperate with the epitaxial layer 12 to define the functioning of the charge coupled device readout circuitry.

Infrared radiation 30 enters through an aperture in the radiation shield 20, passes through insulating layer 18, parts of the epitaxial layer 12, the surface layer 16 and the buried layer 14 to strike the photodetector element 8 and thereby generate a charge in detector 8. The charge, holes in this case, will be collected by the P+ buried layer 14 and injected through the P+ surface layer 16 into the readout circuitry. Adjacent the detector element is a bias electrode 32 to which negative bias from battery 33 is applied. Next to the bias electrode 32 there is a transfer gate electrode 34 and next to it an input electrode 36 of a CCD shift register. The bias electrode, transfer gate electrode and the CCD electrodes are all made through conventional techniques using polycrystalline silicon or appropriate metals such as aluminum. In the exemplary device, polycrystalline silicon was used to make these electrodes. Alternatively, polycrystalline silicon may be used to make the set of electrodes that are relatively close to the epitaxial layer and aluminum for the set of electrodes further from the epitaxial layer.

A second buried layer may be used to shield the CCD operation from the substrate. For the P-channel CCD of our exemplary device, this shield layer 38 is $N^+$ and is located at the portion of the epitaxial layer-substrate interface directly under the CCD. This $N^+$ buried layer enables the room temperature testing of CCD devices even on a thin (i.e. 3–4 μm) epitaxial layer. From the CCD register 36 the charge goes into an MOS output/reset circuit 40.

There is usually a linear array of photodetector elements and they are either used with an optical scanner or they are moved in any convenient manner relative to the scene to be imaged. From each of the photodetector elements 8 a charge transfer path leads orthogonally away from the row of photodetectors to the charge coupled device shift register 36 at the rear of the device which extends in a direction parallel to the row of photodetectors for final readout. Charge is read onto the CCD shift register in parallel and is read out in series.

The details of circuit configuration and mode of operation of the signal readout function, including the operation of the bias electrode, transfer gate and the CCD shift register, have been more fully set forth and explained in our copending application Ser. No. 614,277, filed Aug. 17, 1975. The device claimed in the above-referenced application uses, like the present invention, a CCD circuit for the processing of the readout signal.

Figure 2:
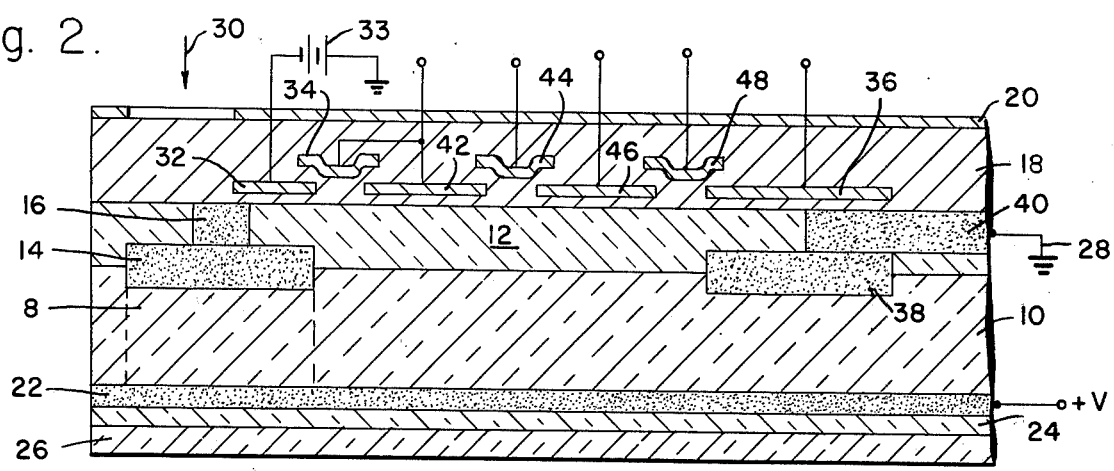
FIG. 2 is a diagrammatic cross-sectional view of the detector depicted in FIG. 1, which further includes a bucket background subtraction circuitry (BBS).

Referring now to FIG. 2, there is shown an IR detector similar to the one shown in FIG. 1 with the addition of a bucket background subtraction circuit (BBS). A more detailed description of the configuration and mode of operation of a bucket background subtraction circuit can be found in our copending application Ser. No. 601,124, filed July 31, 1975, and entitled "Bucket Background Subtraction Circuit for Charge Coupled Devices." From reference to that application it will be seen that the purpose of this portion of the circuitry which may optionally be used in this or other similar imaging devices is to reduce the background or DC component level of the charge signal being supplied to the shift register 36 in order to reduce the charge handling requirements imposed on the shift register. With the detector electrode 22 at an appropriate positive voltage and the bias electrode 32 at an appropriate negative voltage the detector element 8 is biased to act as a photodetector. The holes generated in the P-type detector element 8, by the incidence of infrared radiation 30 and initially collected in the buried layer 14 will be transferred through the surface layer 16 and then under the influence of the bias electrode 32 and the transfer gate 34 will fill the background charge storage potential well under electrode 42. The signal charge then overflows the BBS storage potential barrier which is controlled by the control gate 44 and flows into the signal storage section under electrode 46. The second transfer gate 48 will then clock the charge into the CCD shift register where it is shifted to the output end as described above in connection with FIG. 1. The addition of the BBS circuitry to this basic device affords protection against charge overload in a high IR background environment in a manner more fully explained in our above-referenced copending application (Ser. No. 601,124), but is not otherwise necessary to the operation of the basic device.

Figure 3:
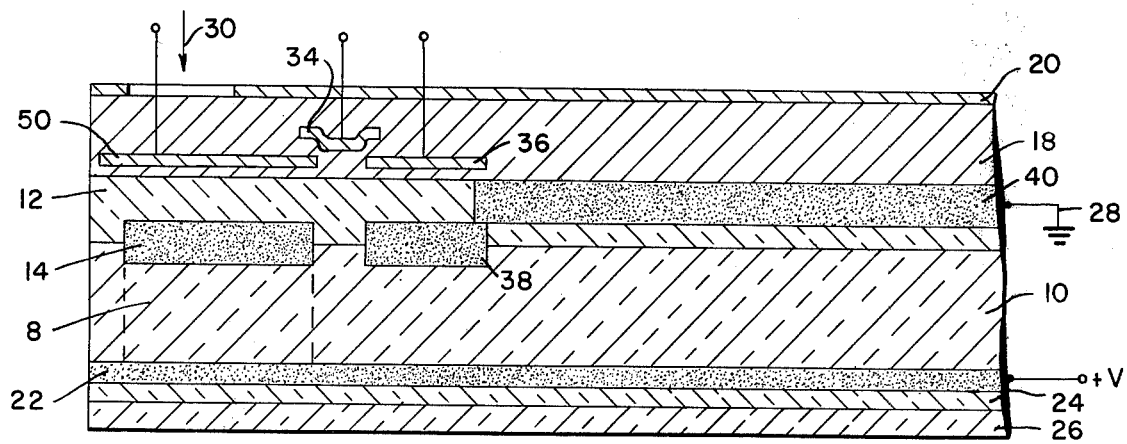
FIG. 3 is a diagrammatic cross-sectional view of another embodiment of this invention. It has both a buried layer for the collection of charges from the detector element and a transparent gate electrode disposed over the epitaxial layer for the formation of a depletion layer for the transfer of these charges to the surface of the epitaxial layer and then injection into the CCD circuitry.

Referring now to FIG. 3, there is shown an image detector similar to the one shown in FIG. 1, but without a surface layer and with a new transparent gate electrode 50 over the epitaxial layer and spatially disposed over the detector element 8 and the buried layer 14. This gate electrode 50 is appropriately biased to create a depletion region on the epitaxial layer extending from the adjacent surface of the epitaxial layer to the buried layer 14.

Figure 4:
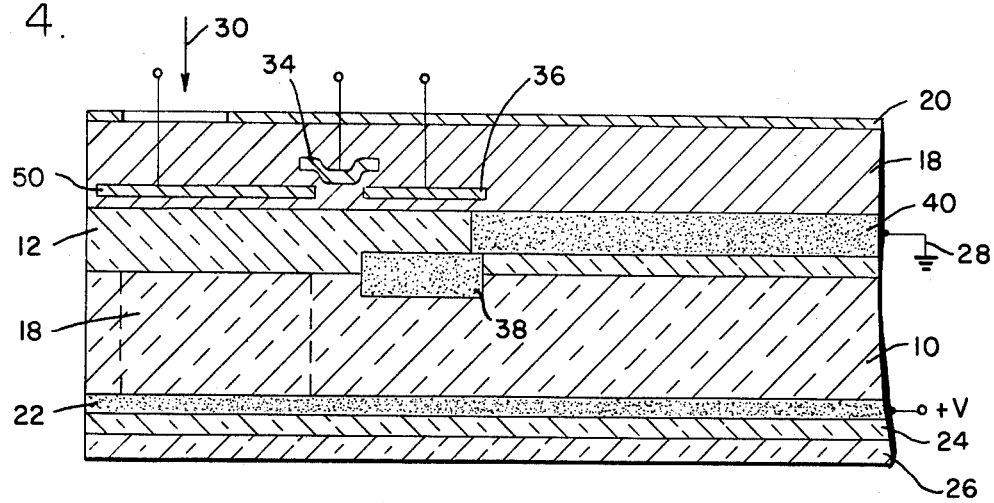
FIG. 4 is a diagrammatic cross-sectional view of another embodiment of this invention. This image detector device does not have a buried gate, but only a transparent gate electrode which forms a depletion layer in the epitaxial layer that reaches the detector element and through which charges can move from the detector area to the surface of the CCD circuitry.

Referring now to FIG. 4, there is shown an image detector like that shown in FIG. 3, but with a somewhat thinner epitaxial layer 12 and without a $P^+$ buried layer. The $P^+$ buried layer may be completely eliminated and substituted entirely by a gate electrode 50 which, when properly biased, can deplete the entire portion of the epitaxial layer below it of mobile charges. Thus the holes generated by incident radiation into the detector element will be collected at the surface of the depleted region of the epitaxial layer and with the appropriate negative bias conditions in electrode 50, the holes will be transferred into the readout circuitry. This alternate embodiment of our invention may be preferable in certain applications where it is desirable to maximize the response speed of the detector. The existence of the $P^+$ buried region creates a capacitance between it and the epitaxial layer. This capacitance reduces the response speed of the detector. However, the advantage of having a $P^+$ buried layer is in providing an effective collector for charges generated in the detector element.

The extrinsic silicon test devices described above as examples were each fabricated on a substrate 10 doped with $3 \times 10^{16}$ gallium atoms per cubic centimeter. An 8-element gallium doped monolithic focal point array was packaged and mounted on a liquid helium cooled finger in an evacuated metal dewar. A heater and temperature sensor mounted on the device package permitted the operating temperature to be controlled between 6° k. and 30° k. A long metal shield cooled by liquid helium had an aperture that limited background photon flux. A narrow band spectral filter centered at 14.5 micrometer rejected visible and shortwave photons. Under these conditions measurements of signal and noise indicated satisfactory operation of such a device operated in accordance with the teaching herein and fabricated in accordance with the detailed structures shown in FIGS. 1, 2, 3 and 4.

Figure 5:
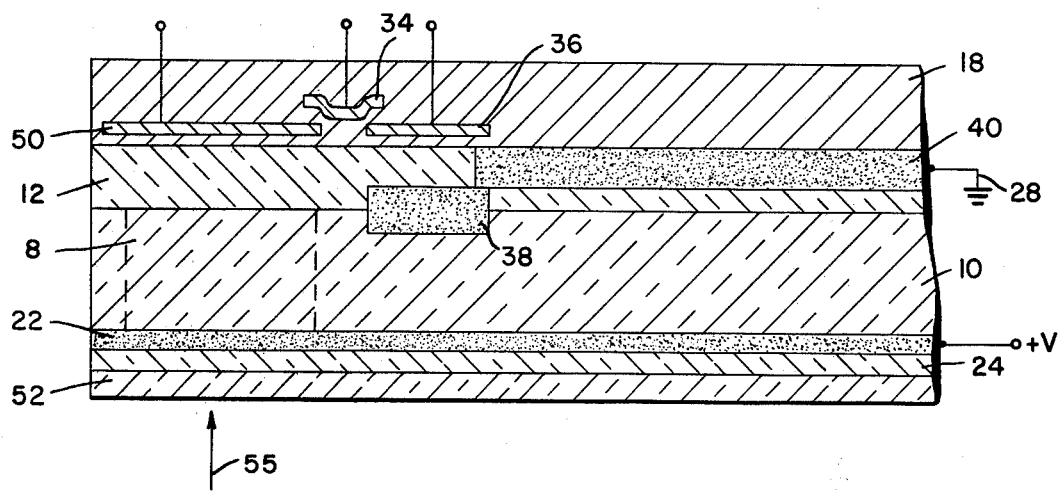
FIG. 5 is a diagrammatic cross-sectional view of the device depicted in FIG. 4 with some modifications to be able to detect radiation entering the detector from the back side.

Referring now to FIG. 5, there is shown a cross-sectional view of a device similar to that depicted in FIG. 4 except that the device of FIG. 5 does not have the optical absorbing layer 26 of FIG. 4, and instead it has an antireflecting coating layer 52. Furthermore, the device of FIG. 5 does not have the radiation shield 20 of FIG. 4. This device is made to operate by detecting infrared radiation 55 incident on its back side. IR radiation 55 will pass through layers 52, 24 and 22 to reach detector element 8. In all other respects the device of FIG. 5 will operate in the way described for the device of FIG. 4. Since the radiation does not have to pass through gate electrode 50 to reach detector element 8, there is no need for the gate electrode 50 to be transparent to IR radiation.

The device of FIG. 5 is favored over that of FIG. 4 in applications in which it is desirable to have more of the incoming radiation reach the detector element. The device of FIG. 5 requires the incoming radiation to go through fewer layers and smaller distances before reaching the detector element. Furthermore, the device of FIG. 5 has a better antireflection surface than that of the device of FIG. 4.

The embodiments depicted in FIGS. 1, 2 and 3 can also be modified to operate with the radiation entering from the back side. The only modifications in the above-referenced figures that are necessary are the elimination of the optical absorbing layer 26, and the radiation shield 20, and for improved performance the addition of an antireflecting coating layer 52.

Figure 6:
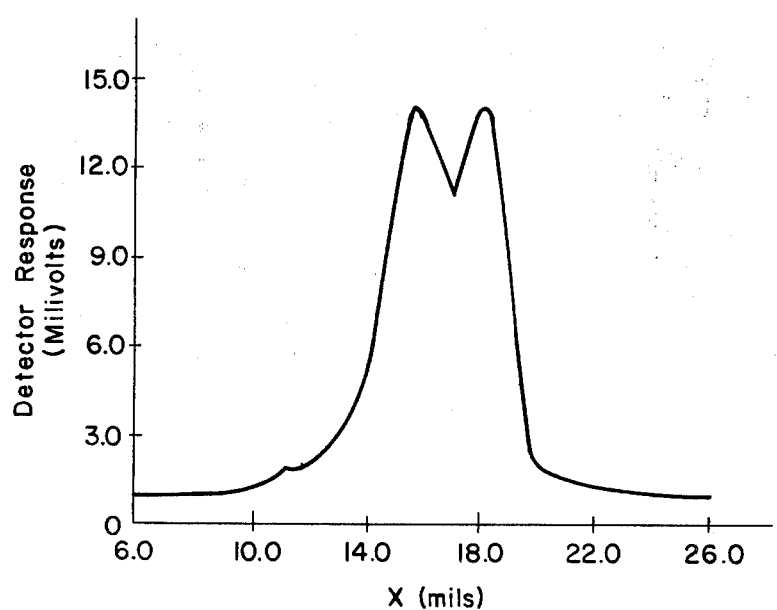
FIG. 6 illustrates a response of an image detector having a collection scheme constructed in accordance with the present invention as shown in FIG. 1, as a function of distance traversing the P+ buried layer.

In FIG. 6 there is shown a plot of the measured response of a detector having a collection scheme constructed in accordance with the present invention as illustrated in FIG. 1, as a function of distance traversing the P+ buried layer.

While the invention has been described in connection with three preferred embodiments, it will be understood that the invention is not limited to those particular embodiments as depicted in the drawings. On the contrary, it is intended to cover all alternatives, modifications and equivalents, as may be included within the spirit and scope of the invention as defined by the appended claims.

What is claimed is:
1. An image detector including in combination:
(a) a semiconductor substrate of a first conductivity type;
(b) a continuous epitaxial layer adjacent to said semiconductor substrate of a second type conductivity;
(c) an optical detector region formed in at least a portion of said semiconductor substrate which is extrinsically doped for generating charge in response to received radiation;
(d) an insulating layer of dielectric material formed on a surface of said epitaxial layer;
(e) at least one heavily doped layer in a portion of the interface between said epitaxial layer and said substrate over said detector region and one heavily doped surface layer in said epitaxial layer to provide a conducting path for the transfer of charge carriers under appropriate biasing conditions from said optical detector region to said surface of said epitaxial layer; and
(f) a plurality of electrode means spaced from said epitaxial layer by at least a portion of said insulating layer for processing charge generated in said optical detector region and moving it along said epitaxial layer to a utilization circuit.

2. In an image detector of the type having at least one optical detector operable to generate electrical charge signals in response to optical radiation, and having means for processing said signals comprising a charge coupled signal collecting device for transferring charge to a utilization circuit, the improvement comprising:
(a) a semiconductor substrate of a first conductivity type having an epitaxial layer of a second conductivity type monolithically formed thereon;
(b) at least one optical detector element formed in said substrate and having at least one surface accessible to optical radiation;
(c) a heavily doped buried layer of a first conductivity type disposed between a portion of said epitaxial layer and a portion of said substrate containing said optical detector;
(d) a heavily doped surface layer of a first conductivity type formed in said epitaxial layer adjacent to a portion of said buried layer and reaching the exposed surface of said epitaxial layer at a predetermined region;
(e) an insulating layer of dielectric material formed on said epitaxial layer;
(f) a plurality of electrode means spaced from said epitaxial layer by at least a portion of said insulating layer for forming said charge coupled signal processing device in said insulating and epitaxial layers to transfer signal charges from said detector element through said buried layer and said surface layer and through said epitaxial layer to said utilization circuit in response to cyclical voltage applied to said electrode means to control the potential profile in said epitaxial layer.

3. A device as set forth in claim 2 which further includes a shield layer with a second type of semiconductivity in the vicinity of a portion of said interface between said epitaxial layer and said substrate and spatially disposed under said charge coupled signal processing device whereby said shield layer shields said substrate from said charge coupled device.

4. A device as set forth in claim 3 wherein said substrate contains a detector electrode formed through the heavy doping of a substrate surface opposite to that on which said epitaxial layer is formed, by a conductivity determining impurity of a first type of conductivity whereby each of said detector elements extends from said detector electrode through said substrate to said buried layer.

5. A device as set forth in claim 4 which further includes an antireflecting layer adjacent said detector electrode and made so as to permit signals of predetermined wavelength to pass through it and through said detector electrode and impinge on said detector element.

6. A device as set forth in claim 4 wherein a plurality of said detector elements are formed in said substrate and positioned colinearly therein to form a line scanner and wherein a radiation shield layer of material which is opaque to said optical radiation is formed on a portion of said insulating layer, whereby said charge coupled signal processing device is shielded from optical radiation while said detector elements are exposed to it through said epitaxial layer which is so made as to permit the radiation to be detected to pass through it.

7. A device as set forth in claim 6 wherein said detector electrode is connected to a source of voltage, appropriate for its conductivity type, and said epitaxial layer is connected to ground.

8. A device as set forth in claim 6 wherein an optical coupling layer and an optical absorbing layer are formed on said detector electrode layer to prevent optical cross talk between detector elements.

9. A device as set forth in claim 6 wherein each of said detectors has operatively associated with it a charge coupled signal collecting device which extends in said epitaxial layer in a direction orthogonal to said line scanner.

10. A device as set forth in claim 9 wherein all of said charge coupled signal collecting devices feed charge signals in parallel into a common serially operated charge coupled shift register.

11. A device as set forth in claim 9 wherein each of said signal collecting devices includes background subtraction circuit means for removing a uniform image background representing D.C. component from said charge signal transmitted through it.

12. In an image detector of the type having at least one optical detector operable to generate electrical charge signals in response to optical radiation, and having means for processing said signals comprising a charge coupled signal collecting device for transferring charge to a utilization circuit, the improvement comprising:
(a) a semiconductor substrate of a first conductivity type having an epitaxial layer of a second conductivity type monolithically formed thereon;
(b) at least one optical detector element formed in said substrate and having at least one surface accessible to optical radiation;
(c) a heavily doped buried layer of a first conductivity type disposed between a portion of said epitaxial layer and a portion of said substrate containing said optical detector;
(d) an insulating layer of dielectric material formed on a surface of said epitaxial layer;
(e) a gate electrode spatially disposed over a predetermined portion of said epitaxial layer and insulated from it by at least a portion of said insulating layer for creating a charge depletion region extending from said buried layer to said surface of said epitaxial layer;
(f) a plurality of electrode means spaced from said epitaxial layer by at least a portion of said insulating layer for forming said charge coupled signal processing device in said insulating and epitaxial layers to transfer signal charge carriers from said detector element through said buried layer and said charge depletion region in said epitaxial layer to said utilization circuit in response to cyclical voltage applied to said electrode means to control the potential profile in said epitaxial layer.

13. A device as set forth in claim 12 which further includes a shield layer with a second type of semiconductivity in the vicinity of a portion of said interface between said epitaxial layer and said substrate and spatially disposed under said charge coupled signal processing device whereby said shield layer shields said substrate from said charge coupled device.

14. A device as set forth in claim 13 wherein a plurality of said detector elements are formed in said substrate and positioned colinearly therein to form a line scanner and wherein a radiation sealed layer of material which is opaque to said optical radiation is formed on a portion of said insulating layer, whereby said charge coupled signal processing device is shielded from optical radiation while said detector elements are exposed to it through said epitaxial layer which is so made as to permit the radiation to be detected to pass through it.

15. A device as set forth in claim 14 wherein:
(a) said substrate has a first type of conductivity;
(b) said epitaxial layer has a second type of conductivity and is thin by comparison to said substrate;
(c) said substrate contains a detector electrode formed through the heavy doping of a substrate surface opposite to that on which said epitaxial layer is formed, by a conductivity determining impurity of a first type of conductivity whereby each of said detector elements extends from said detector electrode through said substrate to said buried layer.

16. A device as set forth in claim 15 wherein said detector electrode is connected to a source of voltage, appropriate for its conductivity type, and said epitaxial layer is connected to ground.

17. A device as set forth in claim 15 wherein an optical coupling layer and an optical absorbing layer are formed on said detector electrode layer to prevent optical cross talk between detector elements.

18. A device as set forth in claim 15 wherein each of said detectors has operatively associated with it a charge coupled signal collecting device which extends in said epitaxial layer in a direction orthogonal to said line scanner.

19. A device as set forth in claim 18 wherein all of said charge coupled signal collecting devices feed charge signals in parallel into a common serially operated charge coupled shift register.

20. A device as set forth in claim 18 wherein each of said signal collecting devices includes background subtraction circuit means for removing a uniform image background representing D.C. component from said charge signal transmitted through it.

21. In an image detector of the type having at least one optical detector operable to generate electrical charge signals in response to optical radiation, and having means for processing said signals comprising a charge coupled signal collecting device for transferring charge to a utilization circuit, the improvement comprising:
(a) an extrinsically doped semiconductor substrate of a first conductivity type haviang a continuous epitaxial layer of a second conductivity type monolithically formed thereon;
(b) at least one optical detector element formed in said substrate and having at least one surface accessible to optical radiation;
(c) an insulating layer of dielectric material formed on a surface of said epitaxial layer;
(d) a transparent gate electrode spatially disposed over a predetermined portion of said epitaxial layer over said optical detector element and insulated from it by at least a portion of said insulating layer for creating a charge depletion region extending from said detector element to said surface of said epitaxial layer and biasing means to apply a potential bias to said transparent gate electrode to attract signal charge carriers, which are minority carriers of said epitaxial layer, from said optical detector element through said charge depletion region to said surface of said epitaxial layer; and
(e) a plurality of electrode means spaced from said epitaxial layer by at least a portion of said insulating layer for forming said charge coupled signal processing device in said insulating and epitaxial layers to transfer signal charge carriers from said detector element through said charge depletion region in said epitaxial layer to said surface of said epitaxial layer and then to said utilization circuit in response to cyclical voltage applied to said electrode means to control the potential profile in said epitaxial layer.

22. A device as set forth in claim 21 which further includes a shield layer with a second type of semiconductivity in the vicinity of a portion of said interface between said epitaxial layer and said substrate and spatially disosed under said charge coupled signal processing device whereby said shield layer shields said substrate from said charge coupled device.

23. A device as set forth in claim 22 wherein a plurality of said detector elements ae formed in said substrate and positioned colinearly therein to form a line scanner and wherein a radiation sealed layer of material which is opaque to said optical radiation is formed on a portion of said insulating layer, whereby said charge coupled signal processing device is shielded from optical radiation while said detector elements are exposed to it through said epitaxial layer which is so made as to permit the radiation to be detected to pass through it.

24. A device as set forth in claim 23 wherein:
(a) said substrate has a first type of conductivity;
(b) said epitaxial layer has a second type of conductivity and is thin by comparison to said substrate;
(c) said substrate contains a detector electrode formed through the heavy doping of a substrate surface opposite to that on which said epitaxial layer is formed, by a conductivity determining impurity of a first type of conductivity whereby eacy of said detector elements extends from said detector electrode through said substrate to said epitaxial layer.

25. A device as set forth in claim 24 wherein said detector electrode is connected to a source of voltage, appropriate for its conductivity type, and said epitaxial layer is connected to ground.

26. A device as set forth in claim 24 wherein an optical coupling layer and an optical absorbing layer are formed on said detector electrode layer to prevent optical cross talk between detector elements.

27. A device as set forth in claim 24 wherein each of said detectors has operatively associated with it a charge coupled signal collecting device which extends in said epitaxial layer in a direction orthogonal to said line scanner.

28. A device as set forth in claim 27 wherein all of said charge coupled signal collecting devices feed charge signals in parallel into a common serially operated charge coupled shift register.

29. A device as set forth in clam 27 wherein each of said signal collecting devices includes background subtraction circuit means for removing a uniform image background representing D.C. component from said charge signal transmitted through it.

* * * * *